US007683815B2

(12) United States Patent
Josefsson et al.

(10) Patent No.: US 7,683,815 B2
(45) Date of Patent: Mar. 23, 2010

(54) CROSS-COUPLED SWITCHED CAPACITOR CIRCUIT WITH A PLURALITY OF BRANCHES

(75) Inventors: Olafur Josefsson, North Reading, MA (US); Khiem Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/133,458

(22) Filed: Jun. 5, 2008

(65) Prior Publication Data

US 2008/0303703 A1    Dec. 11, 2008

Related U.S. Application Data

(60) Provisional application No. 60/942,076, filed on Jun. 5, 2007.

(51) Int. Cl.
*H03M 3/00* (2006.01)
(52) U.S. Cl. ....................................... 341/143; 341/155
(58) Field of Classification Search ................. 341/143, 341/155, 144, 172
See application file for complete search history.

(56) References Cited

U.S. PATENT DOCUMENTS

| 5,001,725 | A | 3/1991 | Senderowicz et al. .......... 375/28 |
| 7,190,296 | B2 * | 3/2007 | Gupta .......................... 341/143 |
| 7,414,557 | B2 * | 8/2008 | Andersson et al. ........... 341/143 |
| 7,508,330 | B1 * | 3/2009 | Chandra ...................... 341/143 |
| 2005/0219105 | A1 | 10/2005 | Liu et al. ..................... 341/155 |

FOREIGN PATENT DOCUMENTS

| EP | 1 755 226 A2 | 2/2007 |
| WO | WO 02/065644 A2 | 8/2002 |

OTHER PUBLICATIONS

*The International Search Report and the Written Opinion of the International Searching Authority*, International Application No. PCT/US2008/065850, International Searching Authority, Oct. 31, 2008, 18 pages.

* cited by examiner

*Primary Examiner*—Peguy JeanPierre
(74) *Attorney, Agent, or Firm*—Sunstein Kahn Murphy & Timbers LLP

(57) ABSTRACT

A cross-coupled switched capacitor circuit that has two branches. During a first phase for the first branch, an input voltage is provided that causes charge to move through a resistor and to be placed onto a plate of the capacitor within the branch. An equivalent amount of charge is transferred to an output node. The output node may be a summing node of a sigma-delta modulator. The summing node is one of the inputs to an operational amplifier that is part of the integrator of the sigma-delta modulator. The resistor and the capacitor in the first branch define an RC circuit and corresponding RC time constant. During the first phase, the capacitor does not reach a fully settled voltage for a desired resolution. During the second phase, the capacitor in the first branch of the circuit is set to a defined voltage. The defined voltage may be the settling voltage had the capacitor been allowed to settle during the first phase. The second branch of the switched capacitor feedback circuit operates similar to the first branch, but on opposite phases. By not requiring the voltage to settle during the first phase, power can be conserved, since the integrator of the sigma-delta modulator does not need to operate as fast with respect to movement of charge.

25 Claims, 8 Drawing Sheets

CROSS-COUPLED SWITCHED CAPACITOR CIRCUIT WITH A PLURALITY OF BRANCHES

PRIORITY

The present invention claims priority from U.S. Provisional Patent Application No. 60/942,076 filed on Jun. 5, 2007 entitled Feedback Loop with Plural Switched Capacitor Branches, which is incorporated herein by reference in its entirety.

FIELD OF THE INVENTION

The invention generally relates to switched-capacitor circuits and, more particularly, the invention relates to cross-coupled switched capacitor circuitry.

BACKGROUND OF THE INVENTION

Sigma-delta modulator circuits may digitize an analog input signal. These circuits often use a 1-bit quantizer, noise shaping and a high oversampling rate in order to digitally render a signal without requiring the sharp anti-aliasing filters that are needed for standard sample-and-hold digital-to-analog converters.

An exemplary first order sigma-delta modulator is shown in FIG. 1 and includes an integrator 100 that receives in an input signal x(t) through an input capacitor (not shown). The integrator 100 is generally followed by a 1-bit quantizer 110 and the sigma-delta modulator also includes a feedback loop 120 that feeds back the digitized output signal from the sigma-delta modulator using a digital to analog conversion 140 to the input of the integrator. The input to the integrator 130 is a summing node that sums the difference between the input signal and the analog version of the output value. The loop integrates the error between the output and the input signals, may low pass filter the input signal and high pass filters the quantization noise, which is the difference between the quantizer input and output. The digital output of the sigma-delta modulator is supplied to a digital decimation filter 150 to account for the oversampling.

In a standard switched capacitor sigma-delta modulator charge is provide once each clock period. During a first phase, the input signal is sampled and during a second phase the voltage on the input capacitor is passed to the integrator. In order to increase the speed, sigma-delta modulators may include cross-coupled summing junctions wherein the input to the integrator receives charge in each clock phase. In addition to increasing the speed of the circuit, by allowing charge to be provided to the integration capacitor on each phase, the input capacitors located prior to the integrator may be half the size of a single phase integrator for the same kT/c noise performance.

Sigma-delta modulators are often used in audio circuits and further are used in cellular telephones where power consumption is always a concern.

SUMMARY OF THE INVENTION

In accordance with one aspect of the invention, a sigma-delta modulator has a given feedback loop with plural branches. At least two branches of the given feedback loop have a switched capacitor circuit. The switch capacitor circuit branches may alternatively conduct. Moreover, the plural branches may have a first branch in parallel with a second branch. The feedback loop may be part of a differential input to a larger feedback loop, or a single ended feedback loop. For example, in some embodiments, the sigma-delta modulator has a second feedback loop that, with the given feedback loop, forms a differential input. The second feedback loop also may have plural branches that also are switched capacitor circuits. As another example, the given feedback loop has a single ended input.

The switched capacitor feedback circuit may have a first and a second branch. During a first phase for the first branch, an input voltage is provided that causes charge to be placed onto a plate of the capacitor. An equivalent amount of charge is transferred to a summing node of the sigma-delta modulator. During a second phase for the second branch, charge is provided to the capacitor in the second branch and an equivalent amount of charge is provided to the summing node of the sigma-delta modulator. The summing node is one of the inputs to the operational amplifier that is part of the integrator of the sigma-delta modulator. During the first phase, the charge is provided through a resistor to the capacitor in the first branch defining an RC circuit and corresponding RC time constant. During the second phase, the capacitor in the first branch of the circuit is set to a defined voltage. In one embodiment, the defined voltage is the settling voltage had the capacitor been allowed to settle during the first phase. Similarly, during the first phase, the capacitor in the second branch of the circuit is set to a defined voltage.

The sigma delta modulator includes an integrator and a quantizer. The output of the quantizer is a digital representation of an input analog signal. The digital output signal may be used to control the switching signals for the switched capacitor feedback circuitry.

In embodiments of the invention, the switched capacitor feedback circuitry for the sigma-delta modulator is combined with a cross-coupled switched capacitor input stage that allows charge to be passed to the sigma-delta modulator on each clock phase. The cross-coupled input stage may also include a plurality of branches. Each branch of the input stage includes a capacitor and a plurality of switchable paths. Each branch has an associated charging phase that activates a first path and a reset phase that activates a second path. During the charging phase, the capacitor for a branch is charged to a level that is less than a fully-settled charge for a desired accuracy. Thus, the charging phase is shorter than the time to fully-settle the capacitor. During the reset phase, the second path is made active and the capacitor is charged to a known voltage level. As a result, the power required to drive the input signal can be reduced.

In other embodiments of the invention, the circuitry and methodology applied to a sigma-delta modulator may be applied to other cross-coupled switched capacitor circuits. For example, other analog-to-digital converters that use switched capacitors may benefit from the disclosed methodology.

In one embodiment of the methodology, a cross coupled switched capacitor circuit has a first and second branch. The first and second branches share inputs and outputs. During a first phase, charge is provided to a capacitor in the first branch of the cross coupled switched capacitor circuit and an equivalent charge is transferred from the capacitor in the first branch to the output. The charge provided to the capacitor in the first branch is less than the fully-settled charge for a predetermined signal resolution. During a second phase, charge is provided to the capacitor in the first branch, so that the capacitor obtains a known voltage level. In some embodiments, the known voltage level is a fully-settled voltage level for the predetermined signal resolution. For the second branch of the embodiment, during a first phase the charge provided to a capacitor in a second branch charges the capacitor to a known voltage level. During the second phase, charge is provided to a capacitor in the second branch and an equivalent charge is passed from the capacitor in the second branch to the output. The charge provided to the capacitor in the second branch is less than the fully-settled charge for the predetermined signal resolution.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Figure 1:
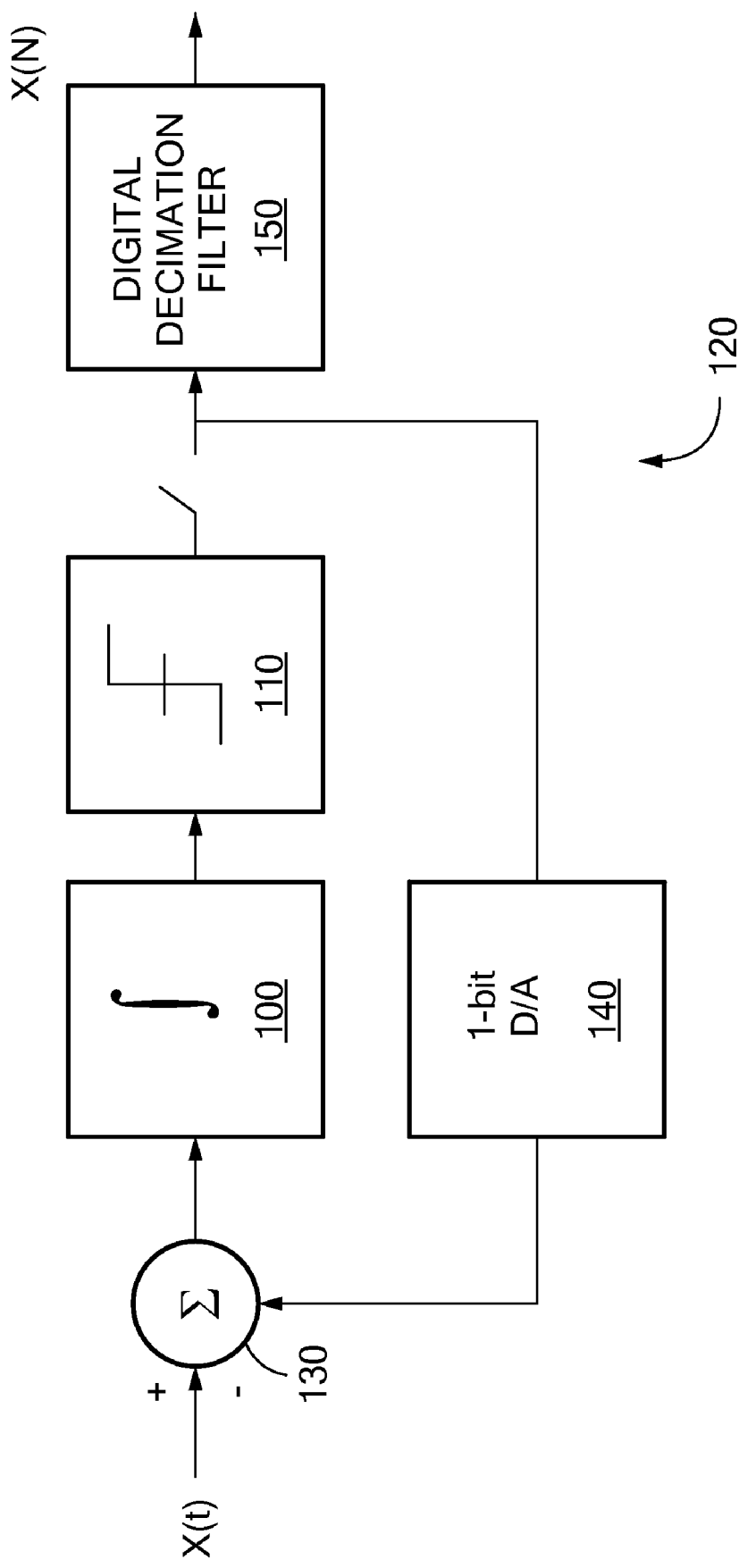
FIG. 1 schematically shows a prior art first-order sigma-delta analog-to-digital converter.

As used herein, the term "period" will mean a segment of time that is made up of two or more phases. A period will generally be associated with the output signal from the sigma-delta modulator unless the context suggests otherwise. Thus, during a period, the output value has a state (either 0 or 1). The term settled/completely settled shall refer to the time necessary for a capacitor's voltage to reach a desired accuracy. For example, to settle to N-bit accuracy a capacitor would take N·Ln(2) time constants. For a capacitor, a time constant refers to its RC time constant.

In illustrative embodiments, the power consumption of a cross-coupled first stage of a sigma-delta modulator is reduced when compared to prior art cross-coupled sigma-delta modulators. A cross-coupled first stage implies that charge is provided to the first stage integrator circuit of the sigma-delta modulator on each clock phase. In addition to an integrator circuit, sigma-delta modulators include a quantizer for quantizing the integrated signal into a digital representation. Additionally, sigma-delta modulators include a feedback loop wherein the feedback loop includes a digital-to-analog converter for converting the digital representation back into an analog signal. The analog signal is summed at the input (summing junction) of the integrator along with the input signal. Because the sigma-delta modulator includes a cross-coupled summing junction, the feedback loop must be active during each phase.

In one embodiment, the digital to analog converter within the feedback loop is a switched capacitor circuit. By relaxing the charging requirements for the switched capacitor circuit in the feedback loop, power can be conserved in the first stage of the sigma-delta modulator. The charging requirements are relaxed such that the switched capacitors need not fully charge and settle during a single phase. By not requiring full settling of the switched capacitor during a single phase, the speed of the operational amplifier that forms the integrator can be reduced and thus, power is saved.

In an embodiment, the feedback loop of the sigma-delta modulator has plural switched capacitor circuits, such that there are at least two branches. The switches of each branch cause the capacitor to undergo a charging phase and a reset phase. While the first branch is in the charging phase the second branch is in the reset phase and vice versa. Thus, during the charging phase, the capacitor within the first branch of the switched capacitor circuit charges/discharges to a value that is less than a full charge/discharge and the voltage level does not completely settle. During the reset phase the capacitor is set to a known value. Preferably, the voltage is set to either a reference voltage or ground. By including a dual branch switched capacitor circuit within the feedback loop, the capacitors can be charged to a known value during the reset period while the second branch provides charge to the summing node of the integrator. Details of illustrative embodiments are discussed below.

Figure 2:
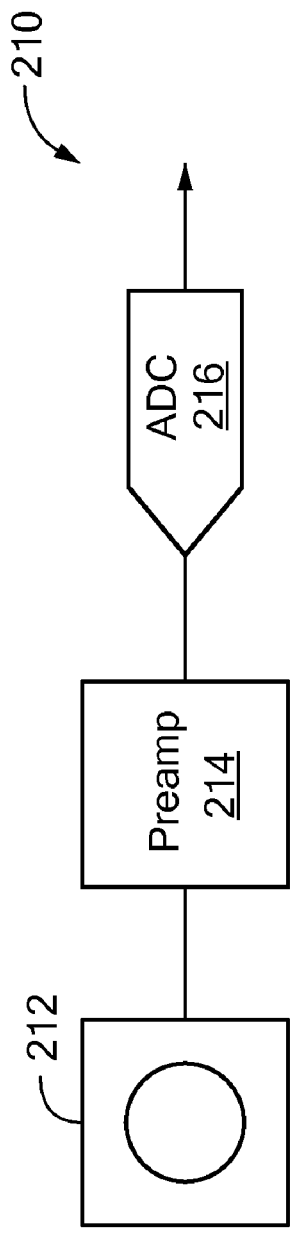
FIG. 2 schematically shows a conventional circuit pipeline for a microphone.

FIG. 2 schematically shows an illustrative circuit 210 used to process an incoming audio signal. To that end, the circuit 210 comprises a microphone 212 for receiving the audio signal and generating an electronic signal representing the received audio signal, and a preamplifier 214 for amplifying the output electronic signal from the microphone 212. The circuit 210 also has an analog to digital converter 216 for converting the amplified output electronic signal into a digital signal. For example, among other implementations, the microphone 212 may be a MEMS microphone within a digital cellular telephone. Circuitry (not shown) within the cellular telephone thus may process the signal for transmission to a local base station and, ultimately, to a remotely located cellular telephone.

Of course, discussion of a cellular telephone, or even a microphone circuit, is for illustrative purposes only. Various other devices may use illustrative embodiments of the invention.

Figure 3:
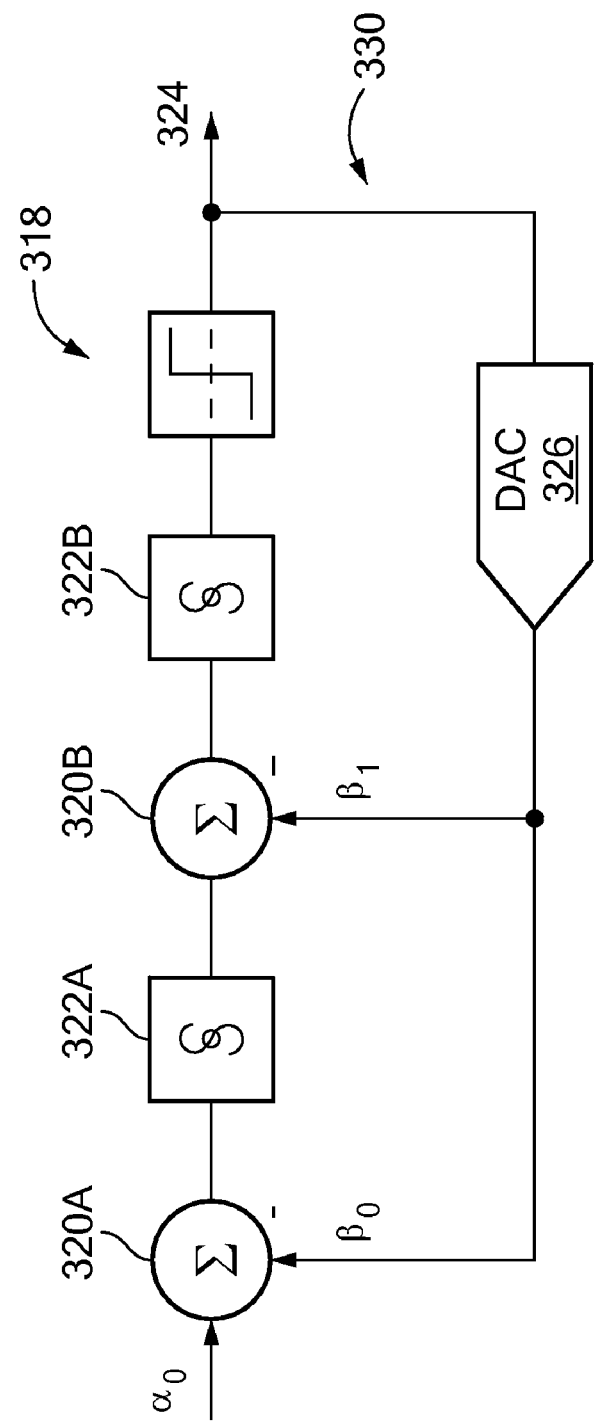
FIG. 3 schematically shows a second order sigma-delta modulator that may be configured in accordance with illustrative embodiments of the invention.

The analog to digital converter 216 illustratively uses sigma-delta modulation. Accordingly, to that end, FIG. 3 schematically shows a second order sigma-delta modulator 318 that may implement illustrative embodiments of the invention. The present invention should not be considered limited by the presented sigma-delta modulator, since other sigma-delta modulators including both first and greater order sigma-delta modulators may benefit from embodiments of the invention as described.

The sigma-delta modulator 318 comprises a first summing node 320A for receiving an input signal (shown as an alpha sub-zero in FIG. 3) and a negative feedback signal (shown as a beta sub-zero in FIG. 3), and a first integrator 322A for receiving the input and feedback signals.

The sigma-delta modulator 318 further includes a second summing node 320B for receiving the output of the first integrator 322A and a second negative feedback signal (shown as beta sub-one). The output of the second summing node 320B feeds into a second integrator 322B having an output coupled to a quantizer 324. The output of the quantizer 324 is the output of the overall sigma-delta modulator 318 (i.e., a digitized version of the input signal alpha sub zero).

A feedback loop 330 coupled with the output generates the two negative feedback signals (beta signals in FIG. 3). Among other possible circuitry, the feedback loop 330 includes a digital to analog converter 326.

Figure 4:
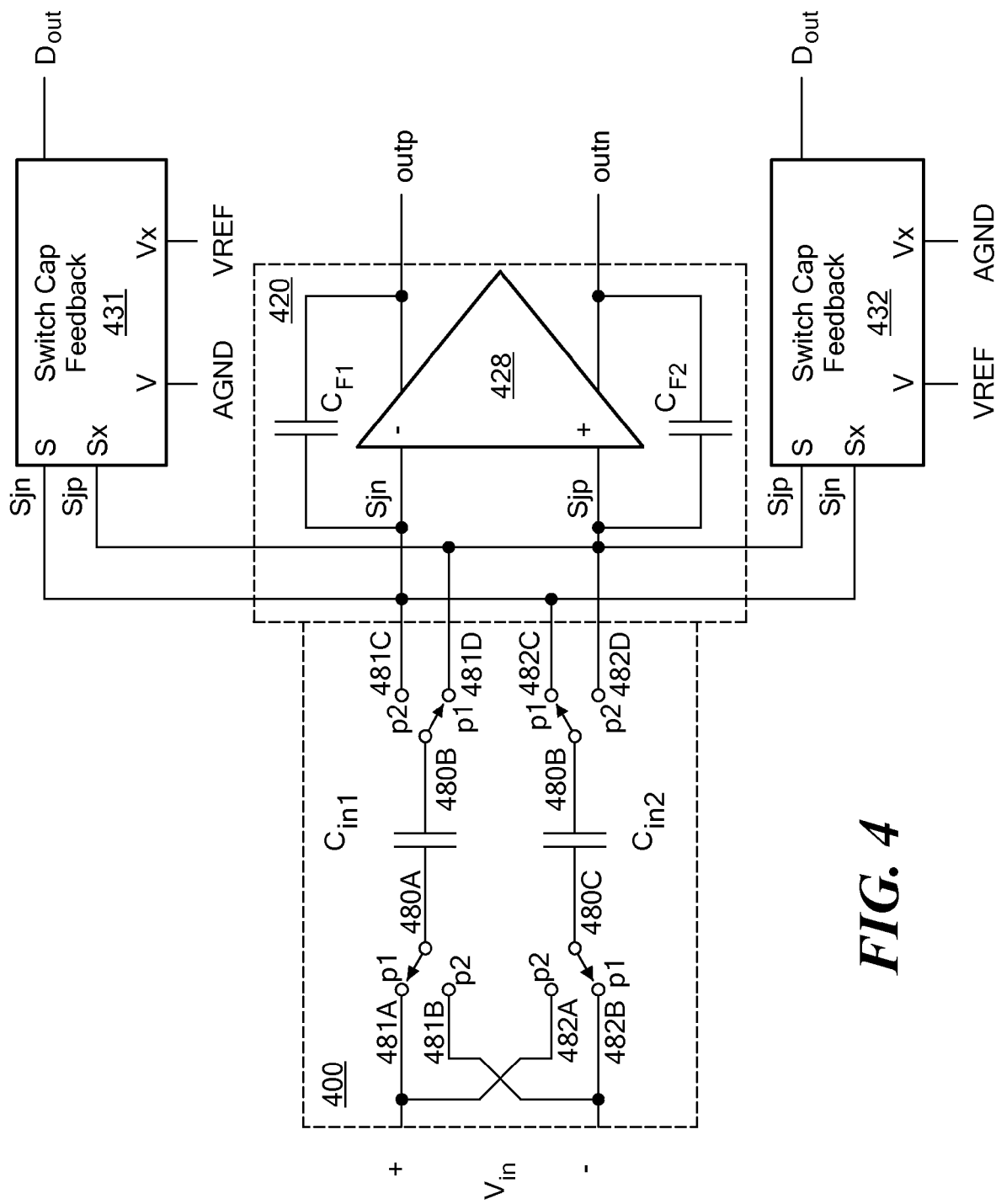
FIG. 4 schematically shows one embodiment of an input stage, integrator, and feedback path within the sigma-delta modulator shown in FIG. 3.

FIG. 4 schematically shows a portion of the sigma-delta modulator of FIG. 3. Embodiments of the invention will be shown with respect to a differential input and output signal. It should be recognized by one of ordinary skill in the art that the disclosed circuitry and methodology may be easily adapted for single ended signals and thus, the invention should not be considered limited to differential signals. FIG. 4 shows a differential cross coupled input stage 400 for receiving in the input signal Vin. The input stage includes input capacitors Cin1, Cin2 along with the cross-coupled switches 480A,B,C,D that switch based upon timing signals P1 and P2 switch between nodes 481A,B,C,D, and 482A,B,C,D. The schematic also shows the first stage differential integrator 420 composed of operational amplifier 428 along with the two capacitors labeled Cf1, Cf2. The integrator receives in a differential input signal from the input stage 400 and produces a differential output signal (outp, outn). Additionally, the figure shows the feedback circuitry 431,432 that represents the digital to analog converter of FIG. 2. The feedback circuitry 431, 432 includes a switched capacitor network having multiple branches.

The charge on the input capacitors Cin1, Cin2 is forwarded to the differential integrators input summing nodes Sjn and Sjp. Thus, when the switches 480a,b,c,d receive timing signal P1, switches 480a and 480b connect to nodes 481a,d, and the charge on the positive terminal of Vin is passed to Cin1 and onto the positive terminal of the operational amplifier Sjp. When the switches 480a,b,c,d receive switching signal P2, this causes the switches 480c,d to couple to nodes 482b,d, and the positive terminal is coupled to the lower input capacitor Cin2 which forwards the charge to the positive terminal of the operational amplifier. The differential output signal (outp, outn) from the integrator (operational amplifier and capacitors Cf1, Cf2) 420 is passed to a quantizer. Prior to reaching the quantizer additional modulator stages may be present. The digital output signal, Dout, from the quantizer is fed back to the switched capacitor feedback circuits 431, 432. The switched capacitor feedback circuits 431,432 perform the function of a 1 bit D/A converter as shown in FIG. 1. The digital output (Dout) from the quantizer is used to control the switching signals for the switches in the branches of the switched capacitor feedback circuit. In addition, the switched capacitor feedback circuit receives in as input voltage levels Vx and V. These voltages are used to produce the charge that is fed back to the input nodes of the integrator (Sjn, Sjp).

Figure 5:
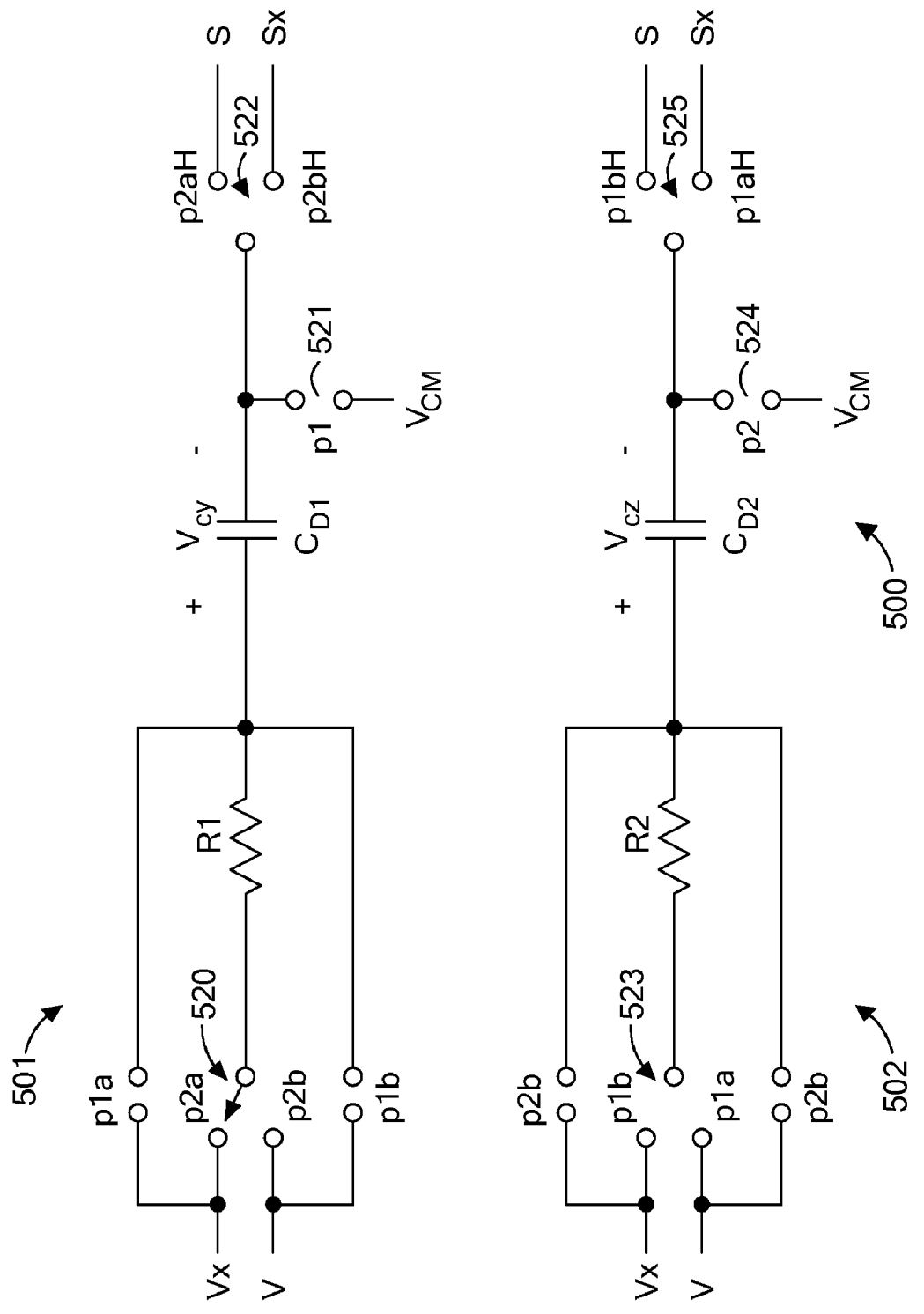
FIG. 5 schematically shows a switched capacitor dual branch feedback circuit that can be used in the feedback path of the sigma-delta modulator of FIG. 4.
Figure 6:
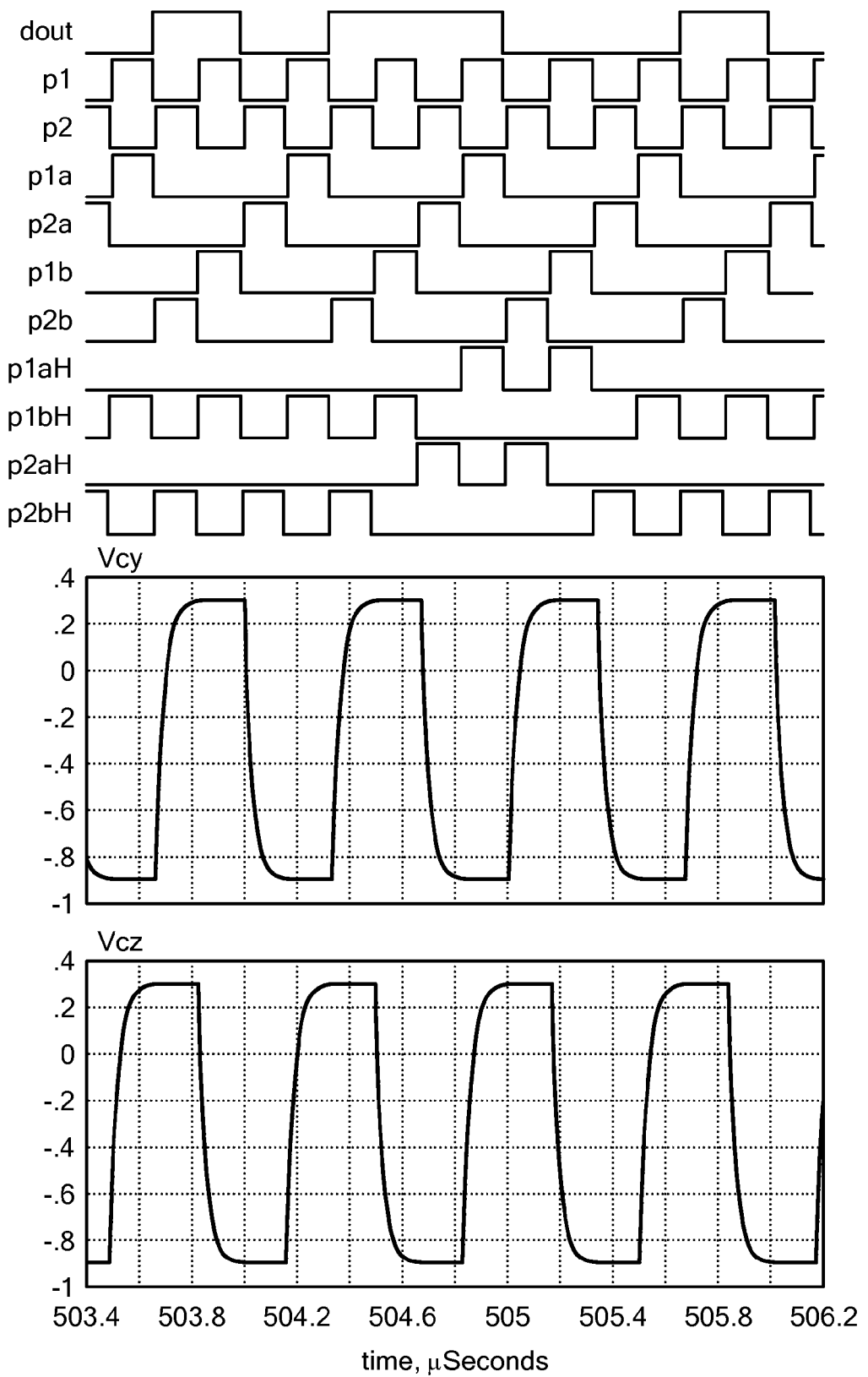
FIG. 6 shows an illustrative timing diagram for use with the switches of the feedback circuit shown in FIG. 5.

FIG. 5 shows an exemplary switched capacitor dual branch feedback circuit. FIG. 6 shows a timing diagram for use with the circuit of FIG. 5 for controlling the switches. The circuit of FIG. 5 could replace each switched capacitor feedback circuit 431,432 in FIG. 4. The switched capacitor dual branch feedback circuit 500 has an upper 501 and a lower 502 branch that are identical except for switch timing. Each branch of the circuit operates over two phases, a charging phase and a reset phase. Although reference is made to the first phase as a charging phase, the capacitor within a branch of the switched capacitor network may be either charging or discharging during this phase. The upper and lower branches 501,502 work on opposite phases such that if the upper branch is in a charging phase the lower branch is in a reset phase and when the upper branch is in a reset phase, the lower branch is in a charging phase.

For each branch, predetermined voltage levels Vx and V are the inputs. In one embodiment, Vx is a reference voltage and V is ground for the upper branch and Vx is ground and V is a reference voltage for the lower branch. At the other end of each branch are switchably coupled nodes S and Sx. Nodes S and Sx are connected to the input nodes of the integrator Sjn and Sjp of FIG. 4.

The charge from the switched input voltages V and Vx for each branch may either be routed through resistor R1, R2 during the charging phase or bypass the resistor during the reset phase. The output signal Dout (e.g. 0 or 1) along with the clock phases p1 and p2 controls the switching signals (p1a, p1b,p2a,p2b,p1aH,p1bH,p2aH, and p2bH) for switches (520-528) as shown in FIG. 6. As used herein, the term switch may imply a one-to-one connection, a many-to-one connection, or a one-to-many connection. A switch may represent a single switch or a plurality of switches (e.g. a multiplexor, demultiplexor)

With reference to the first branch 501 and the timing diagram of FIG. 6, the resistor R1 in combination with the capacitor Cd1 form an RC circuit with an RC time constant. The RC time constant along with the desired resolution of the signal determines the settling time to fully charge the capacitor Cd1 to Vx or discharge the capacitor to V. In the present invention as embodied, during the charging phase, the capacitor Cd1 is allowed to charge or discharge, but does not fully charge or discharge to Vx or V. Therefore, the capacitor does not settle at these values as can be seen in FIG. 6 during the first phase as indicated by timing signal p2. Rather, the voltage Vcy is some fraction of the full settled voltage. As shown in this example, the fully settled voltage is 0.3V. This value is provided for exemplary purposes and should not be considered limiting. Thus, the time to fully settle is greater than one phase of a clock period. In other embodiments, other means for slowing charge transfer during the charging phase may be employed in place of adding a resistance in series with the capacitor. For example, switches could be sized so that they have a higher on-resistance than normally used (e.g. the switches could be made narrow or long). Additionally, a slower operational amplifier could be used to slow the charge transfer as well.

During the reset phase, the capacitor Cd1 for branch 501 is charged to the final value that it could have reached in the charging phase had the resistor not been present (i.e. V or Vx). For example, as shown in FIG. 6 when p1 is high (e.g. 1), the capacitor continues to receive charge and Vcy reaches the settling voltage. As shown in FIG. 6, the exemplary settling voltage is approximately 0.3V. By allowing the voltage to reach a known voltage rather than using the voltage created between the capacitor plates during the first phase, ensures that when the capacitor Cd1 is used in a subsequent phase the starting voltage on its terminals is well established. Branch 502 operates the same as branch 501 except that the charge and reset phases occur at opposite times. Thus, when branch 501 is in a charging phase, branch 502 is in a reset phase and when branch 502 is in a charging phase, branch 501 is in a reset phase. It should be recognized that the known voltage that is placed on the capacitor during the reset phase does not need to be the fully settled voltage level and could be another predetermined voltage level.

In branch 501, during the charging phase (e.g. capacitor is charging/discharging), switch 520 switches based on the switch signals of P2a and P2b that depend on whether Dout is a 1 or a 0 respectively. For exemplary purposes, we will assume that P2a is on and Vx is passed through resistor R1 to Cd1. Vcy charges at the RC time constant rate and provides the charge to either node S or Sx depending on whether switch p2aH or p2bH are active.

During the reset phase for branch 501, switch 520 closes based on switch signal p1a and switch 521 closes when P1 goes high. Thus, the voltage Vx has a direct path to Cd1 and Vcy equals Vx−Vcm. As a result, there is an established voltage on capacitor Cd1 at the beginning of the next charging phase.

Charge is provided to or discharged from the integration capacitors Cf1, Cf2 that are shown in FIG. 4 depending on the state of p2aH, p2bH.

Since the charge that is provided to the capacitors Cd1 and Cd2 on the charging phase is not required to reach the settling voltage during one phase, the speed requirements for the integrator's operational amplifier can be reduced and thus, the amplifier need not be capable of tracking the signal to a fully settled voltage during a single phase. As a result, the power consumed by the integrator's operational amplifier is less than that of a standard cross-coupled sigma-delta modulator.

FIGS. 7a-g show one embodiment of the circuitry for producing the timing signals of FIG. 6. The circuitry receives Dout along with clock signals p1 (first phase) and p2 (second phase) as inputs. The circuitry generates internal signals phase_a and phase_b for producing the clocking signals. Thus, the circuitry uses standard logic gates to create timing signals p1a, p1b, p2a, p2b, p1aH, p2aH, p1bH, p2bH.

Figure 7A:
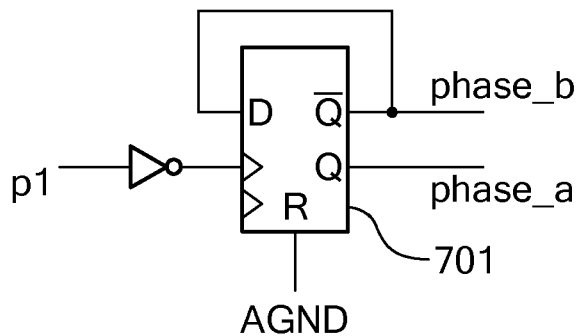
FIGS. 7a-g schematically shows circuitry for generating the timing signals of FIG. 6.
Figure 7B:
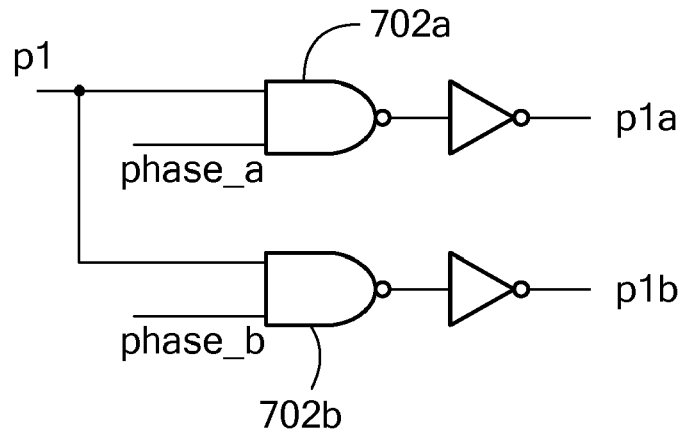
Figure 7C:
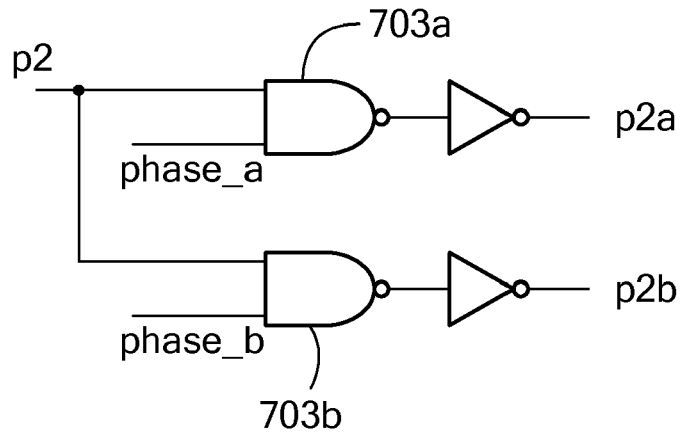
Figure 7D:
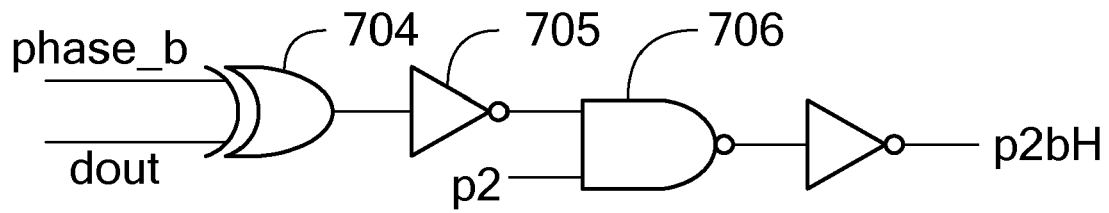
Figure 7E:
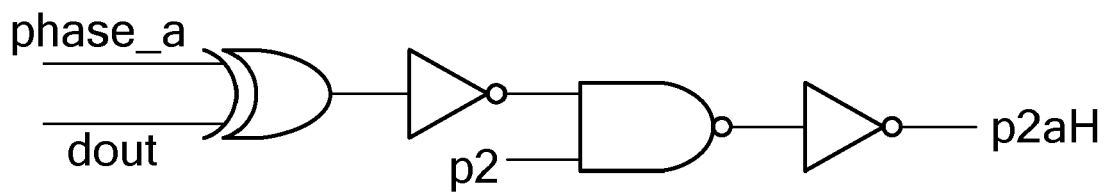
Figure 7F:
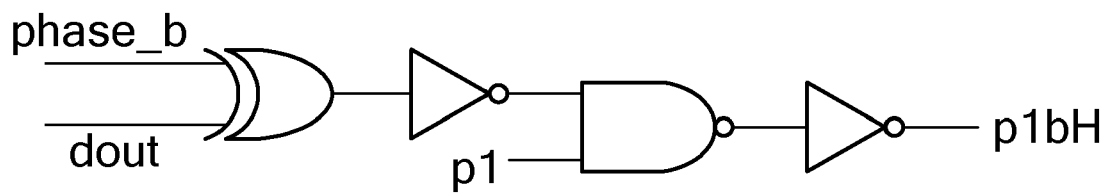
Figure 7G:
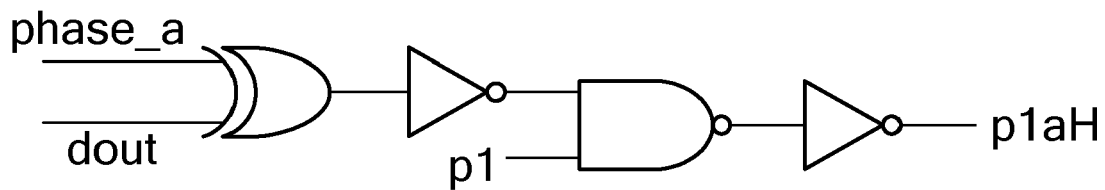

Phase_a and phase_b are the Q and Qbar outputs of a D flip-flop 701 as shown in FIG. 7a. The remaining circuits shown in FIGS. 7b-7g each employ an inverted output followed by an inverter to produce the desired timing signals. The clock signals p1a and p1b are generated as the result of using a logical AND 702a,b with phase_a and phase_b respectively as shown in FIG. 7b. Similarly, timing signals p2a and p2b are created by using a logical AND 703a,b with p2 and timing signals phase_a or phase_b respectively as shown in FIG. 7c. As shown in FIGS. 7d,e,f and g, dout is used in combination with phase_a, phase_b, p1, and p2 to generate p2bH, p2aH, p1bH, and p1aH. Output signal dout and timing signal phase_b are passed through an XOR gate 704. The output is inverted in inverter 705 and the inverted output is passed through a logical AND 706 with clock signal p2 to produce p2bH as shown in FIG. 7d. Generation of timing signals p2aH, p1bH and p1aH each use the same logical structure as FIG. 7d. Thus, an internal phase signal (phase_b or phase_b) and dout are passed through an XOR logic gate. The output is inverted and input into an AND logic gate along with a clock phase signal (p1 or p2). As previously stated, the inverted output of this circuitry is passed through an inverter to produce the timing signal. Although FIG. 7 is separated into sub-FIGS. 7a through 7g, these circuits may be combined into a single circuit.

In an alternative embodiment, the cross-coupled input capacitor circuitry as shown in FIG. 4 can be reconfigured to slow the charge transfer of the input capacitor. During a first phase, the charge placed on the input capacitor is less than the settling charge for a fully settled voltage and during a second phase, the capacitor is charged so as to reach a predetermined voltage, which may be the fully settled voltage. Thus, the input circuitry of FIG. 4 would operate in substantially similar manner to that of the switched capacitor feedback circuitry of FIG. 5. The circuitry of FIG. 8 includes an upper and lower branch, so that when the capacitor of one branch is in a charging phase the other branch is in a reset phase. Thus by having two branches, charge can be passed to the integrator on each phase.

Figure 8:
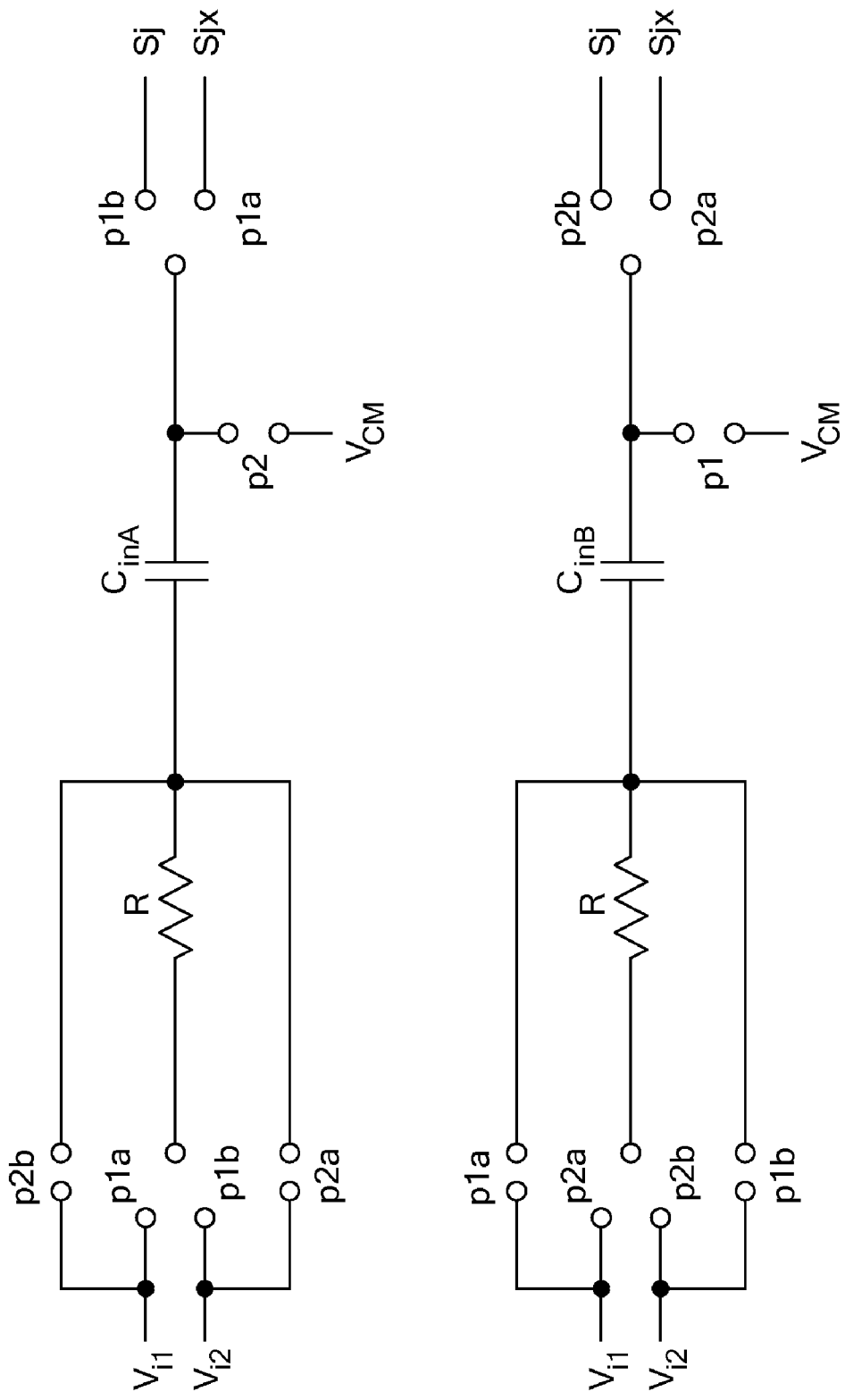
FIG. 8 shows alternative cross-coupled input circuitry that allows charge to be transferred to the integrator on each phase, but also allows power to be reduced.

As shown in FIG. 8, the reconfigured cross-coupled input capacitor circuitry receives input voltage signals Vi1 and Vi2 and the input voltage is coupled to switches that receive timing signals p2b, p1a, p1b, and p2a. In such an embodiment, Vi1 and Vi2 may be a differential voltage signal. It should be recognized that a single ended embodiment could easily be adapted from the presented circuitry. The timing signals used for FIG. 8 may be the same timing signals as shown in FIG. 6.

As shown, during a first phase for the upper branch when p1 is high and p2 is low either p1a or p1b are also high and the voltage Vi1 or Vi2 is passed through resistor R, which slows the transfer of charge to Cina. The timing signals p1b and p1a when high cause charge to be transferred to the input nodes Sj or Sjx of the integrator of FIG. 4. During the second phase (reset phase), either p2b or p2a is active and p2 is high closing its coupled switch and thus, Cina charges to the known voltage of (Vi1 or Vi2)−Vcm. The lower branch operates in a similar fashion except charging/discharging its capacitor (charging phase) when the upper branch is resetting (resetting phase) and resetting when the upper branch is in a charge phase. During the reset phase for each branch, the input capacitors Cina and Cinb are charged to the settling voltage wherein the settling voltage is based upon the necessary accuracy for the circuit.

Embodiments of the invention are not limited to sigma-delta modulators. Rather, the cross-coupled multiple branch switched capacitor circuitry may be used in other applications that have switched capacitors. For example, other analog-to-digital converters may employ the above disclosed methodology in order to reduce power consumption. Further, non-analog-to-digital converters that use switched capacitors may benefit from the reduced power consumption.

The present invention may be embodied in other specific forms without departing from the true scope of the invention. The described embodiments are to be considered in all respects only as illustrative and not restrictive. It should be apparent that those skilled in the art can make various modifications that will achieve some of the advantages of the invention without departing from the true scope of the invention.

What is claimed is:

1. A sigma-delta modulator comprising:
    a feedback loop having plural branches, at least two branches of the feedback loop being a switched capacitor circuit,
    wherein each branch of the feedback loops alternatively conducts wherein each branch of the feedback loop includes a first path that has a resistor and a second path that does not include a resistor.

2. The sigma-delta modulator as defined by claim 1 wherein the plural branches comprise a first branch in parallel with a second branch.

3. The sigma-delta modulator as defined by claim 1 further comprising:
    a second feedback loop, the feedback loop and the second feedback loop forming a differential input.

4. The sigma-delta modulator as defined by claim 3 wherein the second feedback loop also comprises plural branches, each branch of the second feedback loop being a switch capacitor circuit.

5. A sigma-delta modulator comprising:
    a feedback loop having plural branches, at least two branches of the feedback loop being a switched capacitor circuit,
    wherein each branch of the feedback loops alternatively conducts;
    wherein at least one of the branches includes a means for slowing charge transfer to a capacitor within the branch.

6. A sigma-delta modulator comprising:
    a feedback loop having plural branches, at least two branches of the feedback loop being a switched capacitor circuit, cross-coupled switched capacitor input circuitry having a plurality of branches wherein at least one of the branches includes means for slowing charge transfer to a capacitor in the branch such that the charge on the capacitor does not fully settle during a clock phase
wherein each branch of the feedback loops alternatively conducts.

7. A method comprising:
during a first phase:
providing charge to a capacitor in a first switched capacitor branch of a sigma-delta modulator;
transferring an equivalent charge to a summing node of the sigma-delta modulator; and
during a second phase;
providing charge to a capacitor in a second switched capacitor branch of the sigma-delta modulator;
transferring an equivalent charge to the summing node of the sigma-delta modulator
wherein the charge provided to the capacitor in the first switched capacitor branch has a settling time that is longer than the first phase.

8. A method comprising:
during a first phase:
providing charge to a capacitor in a first switched capacitor branch of a sigma-delta modulator;
transferring an equivalent charge to a summing node of the sigma-delta modulator; and
during a second phase;
providing charge to a capacitor in a second switched capacitor branch of the sigma-delta modulator;
transferring an equivalent charge to the summing node of the sigma-delta modulator
wherein the charge provided to the capacitor in the first switched capacitor branch is passed through a resistor.

9. The method according to claim 8, wherein the charge provided to the capacitor in the second switched capacitor branch is passed through a resistor.

10. The method according to claim 8, wherein the resistor and capacitor in the first switched capacitor branch have an associated settling time for a desired resolution and the settling time is longer than the first phase.

11. The method according to claim 10 further comprising:
during the first phase:
setting one or more switches, such that the capacitor in the second switched capacitor branch achieves a settled voltage.

12. The method according to claim 10 further comprising:
during the second phase:
setting one or more switches, such that the capacitor in the first switched capacitor branch achieves a settled voltage.

13. The method according to claim 7 further comprising:
receiving a digitized output signal from the sigma-delta modulator;
using the digitized output signal to determine switching signals for both the first and second switched capacitor branches wherein the first and second switched capacitor branches are part of a feedback loop.

14. A sigma-delta modulator circuit comprising:
an integrator having an input and an output for receiving in at the input an analog input signal and producing at the output an integrated signal of the input;
a quantizer for quantizing the integrated signal and producing at a quantizer output a digital representation; and
a switched capacitor network having at least a first branch and a second branch, the first and the second branches including a plurality of path wherein at least one of the paths slows charge transfer as compared to another path within the branch, the switched capacitor network coupled to the quantizer output and the input of the integrator.

15. A sigma-delta modulator according to claim 14 wherein the first branch contains a capacitor and the capacitor charges to a first voltage during a first phase and to a settled voltage during the second phase.

16. A sigma-delta modulator circuit according to claim 14 wherein at least the first and second branches include a plurality of switchable paths wherein at least one path includes a resistor.

17. A sigma-delta modulator circuit according to claim 14 wherein at least the first and second branches include a plurality of switchable paths wherein at least one path has a slower charge transfer than the other one or more switchable paths.

18. A sigma-delta modulator circuit according to claim 14 wherein the integrator includes an operational amplifier having at least a first and a second input terminal and the integrator further includes a first capacitor coupled between the first input terminal and the output of the integrator and the a second capacitor coupled between the second input terminal and the output of the integrator.

19. A sigma-delta modulator according to claim 14 further comprising:
an input stage including a cross-coupled switched capacitor circuit capable of provide charge to the input of the integrator on each phase.

20. A sigma-delta modulator according to claim 19 wherein the input stage includes a plurality of branches and each branch includes a plurality of switchable paths and at least one path causes charge to be transferred to a capacitor within the branch at a slower rate than in the other one or more switchable paths.

21. A method for use with a cross coupled switched capacitor circuit having at least a first and a second branch that share inputs and outputs, the method comprising:
during a first phase:
providing charge to a capacitor in the first branch of the cross coupled switched capacitor circuit;
transferring an equivalent charge from the capacitor in the first branch to an output;
wherein the charge provided to the capacitor in the first branch is less than the fully-settled charge for a predetermined signal resolution;
during a second phase:
providing charge to the capacitor in the first branch, so that the capacitor obtains a known voltage level.

22. The method according to claim 21, wherein the known voltage level is a fully-settled voltage level for the predetermined signal resolution.

23. The method according to claim 21, further comprising:
during a first phase:
providing charge to a capacitor in a second branch such that the capacitor obtains a known voltage level;
during a second phase:
providing charge to a capacitor in the second branch;
transferring an equivalent charge from the capacitor in the second branch to the output;
wherein the charge provided to the capacitor in the second branch is less than the fully-settled charge for the predetermined signal resolution.

24. A circuit comprising:
a circuit input for receiving an input voltage signal;
a first branch electrically coupled to the circuit input, the first branch having a capacitor and including a plurality of switchable paths wherein each path include the capacitor and at least one branch slows charge transfer of the input voltage signal to the capacitor, the first branch further including a switch wherein when the switch is closed, the capacitor charges to a known voltage;

a second branch electrically coupled to the circuit input, the second branch having a capacitor and including a plurality of switchable paths that each include the capacitor, wherein at least one branch slows charge transfer of the input voltage signal to the capacitor, the first branch further including a switch wherein when the switch is closed, the capacitor charges to a known voltage;

an output; and a switch coupled to the first and second branches for alternating charge transfer from the first and second branches to the output.

25. A circuit according to claim 24, further comprising:

a timing circuit generating a plurality of switching signals including a first phase signal and a second phase signal and providing the first phase signal and the second phase signal to the first and second branches, wherein the first phase signal and the second phase signal cause the first branch to provide charge to the output while the second branch charges the capacitor in the second branch to a known voltage.

* * * * *